(12) United States Patent
Miraglia

(10) Patent No.: US 6,350,658 B1
(45) Date of Patent: Feb. 26, 2002

(54) METHOD FOR REALIZING ALIGNMENT MARKS ON A SEMICONDUCTOR DEVICE DURING A MANUFACTURING PROCESS INCLUDING AT LEAST A CHEMICAL MECHANICAL POLISHING PROCESS STEP

(75) Inventor: Guido Miraglia, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/106,579

(22) Filed: Jun. 29, 1998

(51) Int. Cl.$^7$ ................................................. H01L 21/76
(52) U.S. Cl. .................... 438/401; 438/462; 438/633; 438/975; 257/797
(58) Field of Search ................................ 438/401, 462, 438/975, 633; 257/797

(56) References Cited

U.S. PATENT DOCUMENTS

| | | | |
|---|---|---|---|
| 5,705,320 A | * | 1/1998 | Hsu et al. .................... 438/712 |
| 5,786,260 A | * | 7/1998 | Jang et al. ................... 438/401 |
| 5,801,090 A | * | 9/1998 | Wu et al. ..................... 438/975 |
| 5,911,108 A | * | 6/1999 | Yen ............................. 438/401 |
| 5,923,996 A | * | 7/1999 | Shih et al. ................... 438/462 |

FOREIGN PATENT DOCUMENTS

| | | | | |
|---|---|---|---|---|
| JP | 40 3138920 | * | 6/1991 | .................. 257/797 |
| JP | 40 3161919 | * | 7/1991 | .................. 257/797 |

* cited by examiner

*Primary Examiner*—Olik Chaudhuri
*Assistant Examiner*—Wai-Sing Louie
(74) *Attorney, Agent, or Firm*—Lisa Jorgenson; Susan D. Betcher; Seed Intellectual Property Law Group PLLC

(57) ABSTRACT

A method for realizing alignment marks on a semiconductor device employs a thicker dielectric layer than in the prior art. The method is used during a manufacturing process including at least a Chemical Mechanical Polishing process step, and includes forming alignment marks on a portion of a semiconductor substrate; masking the marks portion during a further deposition step of a first conductive layer covered by a first dielectric layer; depositing a first conformal metal layer over the first dielectric layer and over the marks portion; depositing a second dielectric layer over the first metal layer; and performing a CMP process step to planarize the second dielectric layer; wherein the thickness of the first dielectric layer is high enough that the second dielectric layer covers the alignment marks portion under the level of the first dielectric top surface thereby preventing the CMP process step to planarize the marks portion.

20 Claims, 2 Drawing Sheets

METHOD FOR REALIZING ALIGNMENT MARKS ON A SEMICONDUCTOR DEVICE DURING A MANUFACTURING PROCESS INCLUDING AT LEAST A CHEMICAL MECHANICAL POLISHING PROCESS STEP

TECHNICAL FIELD

The present invention relates to a method for realizing alignment marks on a semiconductor device during a manufacturing process including at least a Chemical Mechanical Polishing process step.

BACKGROUND OF THE INVENTION

As is well known, recent developments of the semiconductor devices manufacturing process have driven to a wider use of Chemical Mechanical Polishing (CMP) process steps to planarize dielectric or conductive layers.

The CMP technique is mainly used to planarize final or pre-metal oxide layers, but it's also used to planarize silicide oxide layers.

The CMP planarization step provides a drawback due to the fact that during such a process step alignment marks are planarized too. Therefore, the manufacturing process is carried on with some difficulties after the above CMP step.

Just as an example, let's now take in consideration some phase of the manufacturing process when contact vias are defined on an intermetal oxide.

As is well known, alignment marks are generally formed on the silicon wafer periphery. To provide metal contacts for the semiconductor device a pre-metal oxide must be planarized and this phase clears all the oxide which is present inside the region where alignment marks are formed.

For a better understanding of this problem let's consider the annexed FIG. 1 which shows a semiconductor silicon wafer substrate portion 2 covered by a polysilicon layer 4. Such a substrate portion presents some alignment marks 3 which are used by a stepper machine to align process masks during the further semiconductor device manufacturing process steps.

The polysilicon layer 4 is covered by a dielectric oxide layer 5. According to a standard process, the oxide layer is etched and removed over the alignment marks region. Then, all the semiconductor portion shown in FIG. 1 is covered by a first metal layer 6. Such a metal layer 6 is conformal and follows very well the profile of the alignment marks, as clearly shown in FIG. 1.

An intermetal oxide layer 7 is deposited over the first metal layer, as shown in FIG. 2.

A CMP planarization step is then performed so that a smooth surface is obtained over the alignment marks region, as shown in FIG. 3.

A subsequent etching step is performed to open contact vias. However, if the intermetal oxide layer has a high thickness, such oxide layer will not be removed by this further etching step.

FIG. 4 shows the result of the etching step on the intermetal oxide layer. The alignment marks portion is covered by a remaining planarized oxide layer.

This remaining oxide layer is transparent and an alignment step may still be performed, but a next second metal layer 8 deposition step cover definitively the alignment marks thereby losing the alignment option.

Some prior art solutions have been suggested to overcome this problem.

A first possible solution may be that of providing further process steps to open again the alignment marks region.

For instance, an opening may be defined over the alignment marks region covered by the intermetal oxide layer and the second metal layer. An etching step is performed to remove the second metal layer over the planarized intermetal oxide layer thereby allowing a stepper machine to "see" again the alignment marks through the transparent oxide layer.

This first solution is worked after the second metal layer deposition step.

A second solution is that of etching and removing a photoresist layer which is provided over the intermetal oxide layer before the CMP planarized step is performed.

Both the above solutions are expensive and require further process steps which are time consuming for the stepper machine.

SUMMARY OF THE INVENTION

One object of the present invention is that of providing a new alignment method to use after a CMP process step.

Another object of the present invention is that of providing a new technique for realizing alignment marks which may be traced by a stepper machine after a second metal deposition phase.

Another object of the present invention is that of providing alignment marks which could be detected even after a CMP process step.

A further object of the present invention is that of providing an electronic semiconductor device including alignment marks which remain visible for a stepper machine even after CMP and metal deposition process steps.

A solution idea behind this invention is that of increasing the thickness of the first dielectric oxide layer deposited around the alignment marks region so that a second dielectric layer would cover the marks region following the marks profile under the level of the first dielectric top surface.

An embodiment of the invention provides for a method as previously indicated and wherein the thickness of the first dielectric layer is high enough that the second dielectric layer covers said alignment marks portion under the level of the first dielectric top surface thereby preventing the CMP process step to planarize said portion.

One embodiment of the invention relates to a method including at least the following steps:

forming alignment marks on a portion of a semiconductor substrate;

masking said portion during a further deposition step of a first conductive layer covered by a first dielectric layer;

depositing a first conformal metal layer over said first dielectric layer and over said portion;

depositing a second dielectric layer over said first metal layer;

performing a CMP process step to planarize said second dielectric layer.

The features and advantages of the method and device according to the invention will be appreciated by the following description of a preferred embodiment given by way of non-limiting example with reference to the enclosed drawings.

DETAILED DESCRIPTION OF THE INVENTION

With reference to the figures, a portion of an electronic semiconductor device including alignment marks according to the present invention is globally indicated with 1.

Figure 1:
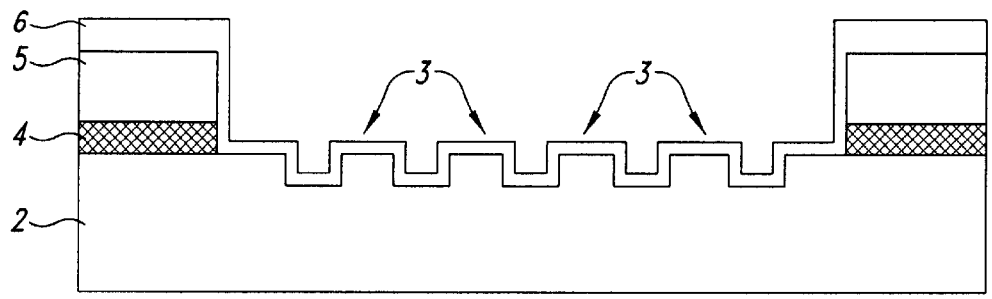
FIG. 1 shows a simplified schematic diagram of a known semiconductor device portion including some alignment marks.
Figure 2:
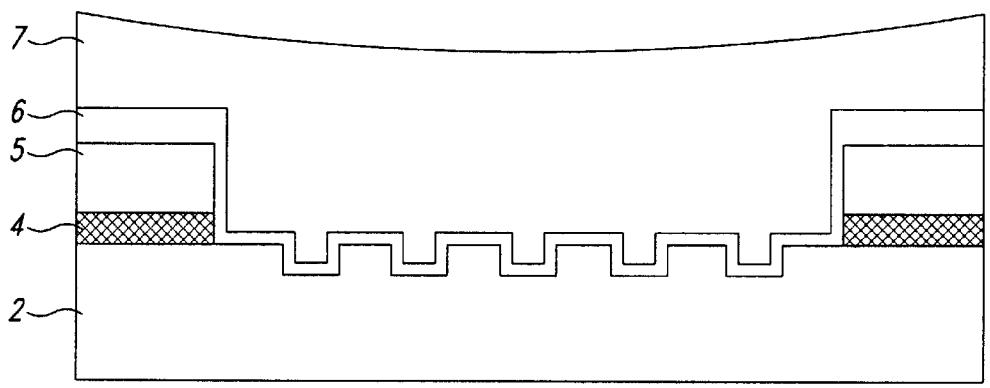
FIGS. 2 and 3 show simplified schematic diagrams of the semiconductor device portion of FIG. 1 after process steps according to the prior art.
Figure 3:
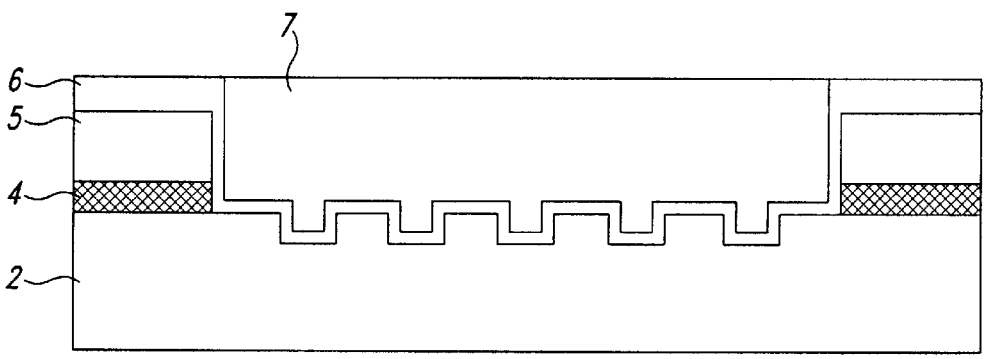
Figure 4:
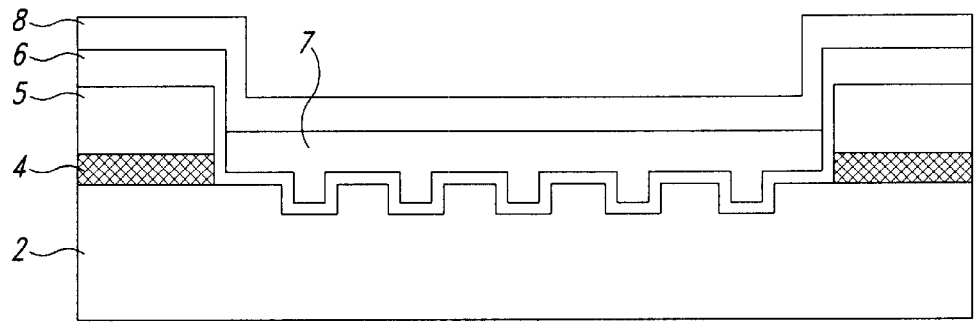
FIG. 4 shows a schematic diagram of the semiconductor portion of FIG. 1 after a further process step according to the prior art.
Figure 5:
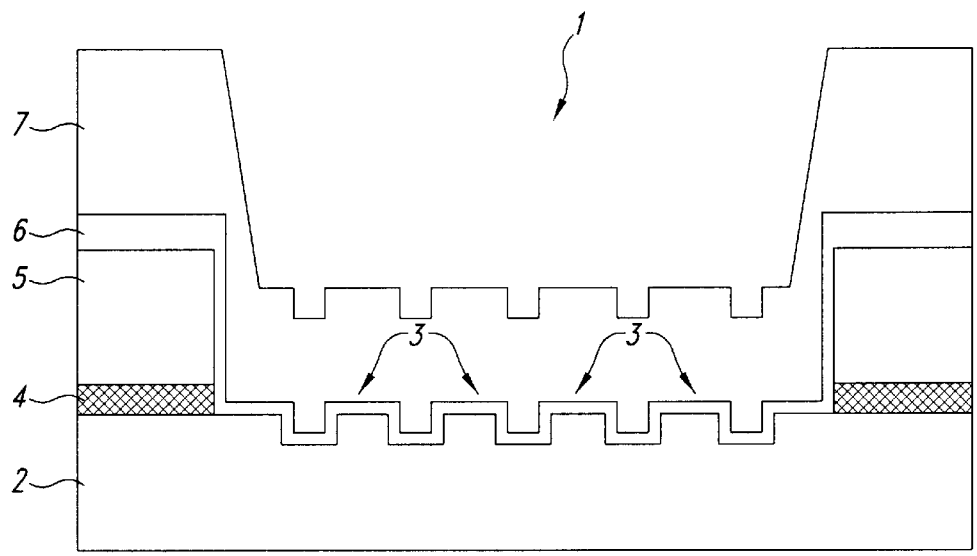
FIG. 5 shows a simplified schematic diagram of a semiconductor device portion including some alignment marks which are realized according to the inventive process steps.

The portion 1 comprises a silicon substrate 2 which is common to the whole semiconductor device. Moreover, many devices of the same kind are integrated on a same semiconductor wafer and alignment marks 3 of the kind shown in FIG. 5 may be realized at the periphery of the semiconductor wafer.

According to the present invention a method is provided for realizing the alignment marks 3 on the semiconductor device during a manufacturing process including at least a Chemical Mechanical Polishing process step.

The method according to an embodiment of the invention includes the following steps:

forming the alignment marks 3 on the portion 1 of a semiconductor substrate 2;

masking said portion 1 during a further deposition step of a first conductive layer 4 covered by a first dielectric layer 5.

The first conductive layer 4 may be a polysilicon layer, while the first dielectric layer 5 may be a pre-metal or contact oxide.

According to the illustrated embodiment, the thickness of the first dielectric layer 5 is very high. More specifically, the thickness of the dielectric layer 5 is higher than the thickness usually provided according to standard and prior art processes of this kind.

More particularly, the higher thickness of the first dielectric layer 5 may even be provided just around the semiconductor portion 1 where the alignment marks 3 are formed.

The process according to the embodiment is carried on by depositing a first conformal metal layer 6 over the first dielectric layer 5.

Such a metal layer 6 covers also the semiconductor portion 1 where the alignment marks 3 are formed. Moreover, the metal layer 6 follows the alignment marks profile.

Now, a second dielectric layer 7 is deposited over said first metal layer 6. This second dielectric layer is an inter-metal oxide wherein openings for contact vias may be defined.

The thickness of this second dielectric layer 7 is more or less the same as the first dielectric layer 5. However, it must be appreciated that thickness of the first dielectric layer 5 may be equal or greater than the thickness of the second dielectric layer 7.

Due to the high thickness of the first dielectric layer 5, which covers the poly layer 4, the second dielectric layer 7 is deposited over the alignment marks portion 1 but the height of this deposited layer doesn't reach the height over the substrate of first dielectric top surface.

In other words, on the portion 1 the second dielectric layer 7 covers in a conformal manner the alignment marks 3 and the first metal layer 6 following the marks profile under the level of the first dielectric top surface. This is clearly shown in FIG. 5.

A CMP process step is then performed to planarize said second dielectric layer 7.

However, this CMP process produces a selective result over the central portion of the semiconductor wafer and over the wafer periphery. As a matter of fact, the CMP step etches the oxide layer more deeply in the central wafer portion, so that the second dielectric layer remaining thickness is higher at the wafer periphery than in the central wafer portion.

This higher thickness represents a barrier against the CMP planarization on the alignment marks portion 1.

In other words, the CMP process step doesn't reach the second dielectric layer portion covering the marks profile.

Figure 6:
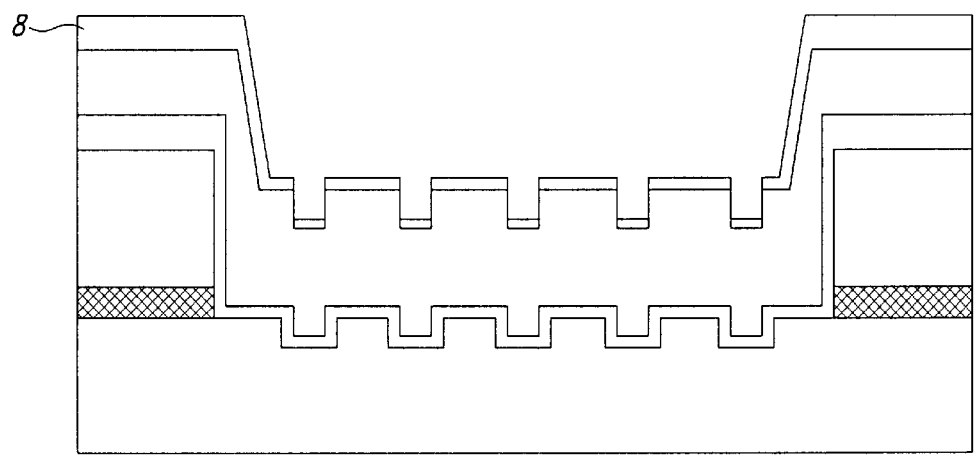
FIG. 6 shows the semiconductor portion of FIG. 5 after further process steps according to the present invention.

The process is continued by the deposition of a second metal layer 8 which covers the second dielectric layer 7 (shown in FIG. 6).

FIG. 6 shows the result of this last deposition step. It may be appreciated that even the second metal layer 8 follows the marks profile thereby allowing a stepper machine to use the alignment marks 3 for alignment purposes.

The method according to the invention and the semiconductor device so obtained allow keeping the alignment marks profile after a CMP process step.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for realizing alignment marks on a semiconductor device during a manufacturing process including at least a Chemical Mechanical Polishing process step, the method including the following steps:

forming alignment marks on a portion of a semiconductor substrate;

masking said portion during a further deposition step of a first conductive layer covered by a first dielectric layer having a top surface;

depositing a first conformal metal layer directly on said first dielectric layer and over said portion;

depositing a second dielectric layer directly on said first metal layer, said second dielectric layer having a thickness;

performing a CMP process step to planarize said second dielectric layer;

wherein the first dielectric layer has a thickness high enough that the second dielectric layer covers said alignment marks portion under the level of the first dielectric top surface thereby preventing the CWP process step to planarize said portion.

2. The method according to claim 1 wherein the alignment marks are formed on a semiconductor wafer periphery.

3. The method according to claim 1 wherein the first dielectric layer is a pre-metal oxide.

4. The method according to claim 1 wherein the second dielectric layer is an intermetal oxide.

5. The method according to claim 1 wherein the thickness of the first dielectric layer is equal or greater than the thickness of the second dielectric layer.

6. The method according to claim 1 wherein said second dielectric layer is conformal.

7. The method according to claim 1 wherein said first conductive layer is polysilicon.

8. The method according to claim 1 wherein a second metal layer is deposited after the CMP process step.

9. The method according to claim 5 wherein the thickness of the first dielectric layer is higher just around the semiconductor portion where the alignment marks are formed than in adjacent areas.

10. A semiconductor device including alignment marks formed by a manufacturing process including at least a Chemical Mechanical Polishing process step, the device comprising:

a portion of a semiconductor substrate on which alignment marks are formed;

a first conductive layer and a first dielectric layer covering the substrate around said portion, said first dielectric layer having a top surface;

first conformal metal layer immediately over said first dielectric layer and over sad portion;

a second dielectric layer immediately over sad first metal layer, said second dielectric layer being planarized by a CRP process step;

wherein the first dielectric layer has a thickness high enough that the second dielectric layer covers said alignment marks portion under the level of the first dielectric top surface thereby preventing the CMP process step from planarizing said portion.

11. The device according to claim 10 wherein the alignment marks are formed on a semiconductor wafer periphery.

12. The device according to claim 10 wherein the first dielectric layer is a pre-metal oxide.

13. The device according to claim 10 wherein the second dielectric layer is an intermetal oxide.

14. The device according to claim 10 wherein the thickness of the first dielectric layer is equal or greater than the thickness of the second dielectric layer.

15. The device according to claim 10, further comprising a second metal layer over and conformal with the second dielectric layer.

16. A semiconductor device comprising:

a semiconductor substrate having a surface with alignment marks;

a first conductive layer over the substrate and adjacent to the alignment marks;

a first dielectric layer directly on the first conductive layer;

a second conductive layer over the first dielectric layer and conformal with the alignment marks; and a second dielectric layer over and conformal with the second conductive layer.

17. The semiconductor device of claim 16 wherein the second dielectric layer has top surface level over the alignment marks that is below a top surface level of the first dielectric.

18. The semiconductor device of claim 16, further comprising a third conductive layer over and conformal with second dielectric layer.

19. The semiconductor device of claim 16 wherein the first conductive layer is polysilicon and the second and third conductive layers are metal.

20. The semiconductor device of claim 16 wherein the first dielectric layer has a thickness that is greater than or equal to a thickness of the second dielectric layer.

* * * * *

UNITED STATES PATENT AND TRADEMARK OFFICE
CERTIFICATE OF CORRECTION

PATENT NO. : 6,350,658 B1
DATED : February 26, 2002
INVENTOR(S) : Guido Miraglia It is certified that error appears in the above-identified patent and that said Letters Patent is hereby corrected as shown below:

Column 5,
Line 20, "over sad portion;" should read -- over said protion; -- in the issued patent.

Lines 21 and 22, "over sad first metal layer," should read -- over said first metal layer, --
Lines 22 and 23, "by a CRP process step;" should read -- by a CMP process step; --

Signed and Sealed this

Twenty-first Day of May, 2002

*Attest:*

*Attesting Officer*

JAMES E. ROGAN
*Director of the United States Patent and Trademark Office*